United States Patent
Cai et al.

(10) Patent No.: US 8,659,091 B2
(45) Date of Patent: Feb. 25, 2014

(54) EMBEDDED STRESSORS FOR MULTIGATE TRANSISTOR DEVICES

(75) Inventors: Ming Cai, San Diego, CA (US); Dechao Guo, Fishkill, NY (US); Pranita Kulkarni, Slingerlands, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,068

(22) Filed: Sep. 12, 2012

(65) Prior Publication Data

US 2013/0154029 A1 Jun. 20, 2013

Related U.S. Application Data

(63) Continuation of application No. 13/325,506, filed on Dec. 14, 2011.

(51) Int. Cl.
*H01L 29/78* (2006.01)

(52) U.S. Cl.
USPC .... 257/368; 257/347; 257/288; 257/E29.264; 438/299; 438/300

(58) Field of Classification Search
USPC ................ 257/369, 347; 438/283, 299, 300
See application file for complete search history.

(56) References Cited

U.S. PATENT DOCUMENTS

| | | | |
|---|---|---|---|
| 7,462,916 B2 | 12/2008 | Williams et al. | |
| 8,022,488 B2 * | 9/2011 | Cheng et al. | 257/408 |
| 2009/0283829 A1 | 11/2009 | Dyer et al. | |
| 2010/0148217 A1 | 6/2010 | Simonelli et al. | |
| 2010/0155790 A1 | 6/2010 | Lin et al. | |
| 2010/0187578 A1 * | 7/2010 | Faltermeier et al. | 257/288 |
| 2010/0219474 A1 | 9/2010 | Kronholz et al. | |
| 2011/0024804 A1 | 2/2011 | Chang et al. | |
| 2011/0068407 A1 * | 3/2011 | Yeh et al. | 257/369 |
| 2011/0073952 A1 | 3/2011 | Kwok et al. | |
| 2011/0147828 A1 | 6/2011 | Murphy et al. | |
| 2011/0291189 A1 | 12/2011 | Cheng et al. | |
| 2012/0261718 A1 * | 10/2012 | Sosa Cortes et al. | 257/192 |
| 2013/0052779 A1 | 2/2013 | Flachowsky et al. | |

OTHER PUBLICATIONS

Tamura et al., "Embedded Silicon Germanium (eSiGe) technologies for 45nm nodes and beyond," 2008 8th International Workshop on Junction Technology (IWJT '08)—Extended Abstracts pp. 73-77, May 2008.*
"Embedded silicon germanium (eSiGe) technologies for 45nm nodes and beyond," in 2008 8th International Workshop on Junction Technology (IWJT '08)—Extended Abstracts, pp. 73-77, May 2008.*
Tan et al., "Strained p-Channel FinFETs With Extended Π-Shaped Silicon—Germanium Source and Drain Stressors," Electron Device Letters, IEEE , vol. 28, No. 10, pp. 905-908, Oct. 2007.
Office Action issued Nov. 20, 2012 for U.S. Appl. No. 13/325,506, filed Dec. 14, 2011. (13 Pages).
Final Office Action issued Feb. 15, 2013 for U.S. Appl. No. 13/325,506, filed Dec. 14, 2011. (10 Pages).
Office Action issued May 21, 2013 for U.S. Appl. No. 13/325,506, filed Dec. 14, 2011. (12 Pages).

* cited by examiner

*Primary Examiner* — Matthew W Such
*Assistant Examiner* — Stephen Bradley
(74) *Attorney, Agent, or Firm* — Tutunjian & Bitetto, P.C.; Vazken Alexanian

(57) ABSTRACT

Multigate transistor devices and methods of their fabrication are disclosed. In accordance with one method, a fin and a gate structure that is disposed on a plurality of surfaces of the fin are formed. In addition, at least a portion of an extension of the fin is removed to form a recessed portion that is below the gate structure, is below a channel region of the fin, and includes at least one angled indentation. Further, a terminal extension is grown in the at least one angled indentation below the channel region and along a surface of the channel region such that the terminal extension provides a stress on the channel region to enhance charge carrier mobility in the channel region.

14 Claims, 8 Drawing Sheets

EMBEDDED STRESSORS FOR MULTIGATE TRANSISTOR DEVICES

RELATED APPLICATION DATA

This application is a Continuation application of U.S. patent application Ser. No. 13/325,506 filed on Dec. 14, 2011, incorporated herein by reference in its entirety.

BACKGROUND

1. Technical Field

The present invention relates to transistor devices, and, more particularly, to multigate transistor devices and systems, and methods of their fabrication and use.

2. Description of the Related Art

Throughout the evolution and advancement of computing devices, the reduction of their size and their power consumption in a way that maintains or improves a high processing capacity has long been a design goal. Planar field-effect transistor (FET) devices, which have been widely used in integrated circuits for the past several decades, were found to be increasingly inefficient on the nanometer scale. Reducing the size of the channel between the terminals of planar transistors to this scale leads to an inefficient leakage of current in the off-state of the transistor, resulting in an increase in power consumption in its idle state. Multigate field-effect transistors (MuGFET) have been developed to address this problem, as they incorporate several gates that surround the channel between a source and drain terminal of the transistor on a plurality of surfaces, thereby enabling the suppression of leakage current in the off-state.

There are several different types of multi-gate devices. FinFETs and Trigate devices are two examples. FinFET devices include a thin fin, which can be made of silicon, that provides the channel between a source and a drain. The fin can be overlaid with a plurality of gates, where the gates can be on opposing sides of the fin. Trigates are similar to FinFETs in that they also employ fins. However, in a Trigate device, two vertical gates respectively envelope separate fins and a single top gate is overlaid on the two vertical gates. The top gate usually extends across a plurality of transistor cells in Trigate devices.

SUMMARY

One embodiment of the present principles is directed to a method for fabricating a multigate transistor device. The method includes forming a fin and a gate structure that is disposed on a plurality of surfaces of the fin. In addition, at least a portion of an extension of the fin is removed to form a recessed portion that is below the gate structure, is below a channel region of the fin, and includes at least one angled indentation. Further, a terminal extension is grown in the at least one angled indentation below the channel region and along a surface of the channel region such that the terminal extension provides a stress on the channel region to enhance charge carrier mobility in the channel region.

Another embodiment of the present principles is directed to a multigate transistor device. The device includes a gate structure, a channel region, a recessed portion and source and drain extensions. The gate structure includes a gate electrode and a gate dielectric. In addition, the channel region includes a plurality of surfaces on which the gate structure is disposed and is configured to provide a conductive channel between a source and a drain of the device in response to activation by the gate structure. Further, the recessed portion is below the gate structure and the channel region and includes at least one angled indentation. The source and drain extensions are in contact with the channel region. At least one of the source or drain extensions extends into the one or more indentations below the channel region and provides a stress on the channel region such that charge carrier mobility is enhanced in the channel region.

An alternative embodiment is directed to a circuit apparatus. The apparatus includes a plurality of multigate devices and a gate structure. Each of the multigate devices includes a channel region, a recessed portion and a terminal extension. The channel region includes a plurality of surfaces on which the gate structure is disposed and is configured to provide a conductive channel between a source and a drain of the respective multigate device in response to activation by the gate structure. In addition, the recessed portion is below the gate structure and the channel region and includes at least one angled indentation. The terminal extensions of the multigate devices form a cohesive lattice structure that is in contact with each of the channel regions of the multigate devices, extends into each of the indentations below the channel regions of the multigate devices and provides stresses on the channel regions such that charge carrier mobility is enhanced in the channel regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
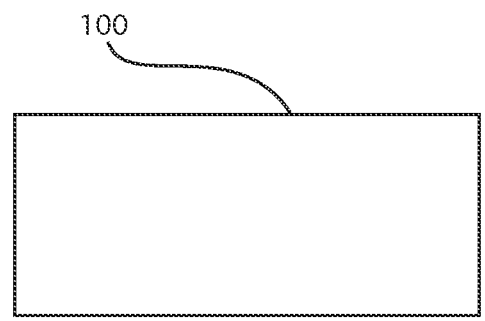
FIG. 1 is a cross-sectional view of an exemplary substrate for a transistor device in accordance with an embodiment of the present principles.

Multigate devices provide an excellent building block for nanometer scale integrated circuit designs due to their effectiveness in the suppression of leakage current. However, to meet increasing demands for computing devices with low power consumption, the energy consumption of integrated circuit elements should be reduced as much as possible. The energy efficiency of multigate devices can be improved by reducing resistance in the channel regions and at the source and drain regions of the devices. For example, the series resistance at the source and drain regions of multigate devices can be reduced by merging the fins of such devices through a selective, epitaxial growth of undoped silicon, doped silicon, doped SiGe, or other suitable materials, in regions between the fins. Moreover, the resistance in the channel region of the multigate device can be reduced through the imposition of appropriate stresses. For example, the introduction of a tensile stresses to the channel region can improve electron mobility in NFET (n-type field effect transistor) devices while the introduction of compressive stresses can improve hole mobility in PFET (p-type field effect transistor) devices. However, although the epitaxially grown material that is used to merge fins may appear to be a means for imposing stresses in the channel region, replacing this material with a stressor provides little stress benefit due to volume and proximity limitations of multigate devices.

According to one aspect of the present principles, an effective stressor can be implemented in a multigate device by removing portions of the fins below the channel region of the device and epitaxially growing semiconductor material to form sigma-shaped stressors in the resulting recesses. Here, due to the shape and positioning of the recesses in the fins, the epi stressor can be embedded in the device close to the channel region and thereby improve the effectiveness of the stressors. Furthermore, to restrict dopant diffusion in the channel region as a result of thermal annealing, the sigma-shaped portion of the stressors are disposed beneath the channel region of the fin. The curbing of dopant diffusion in the channel region is desirable, as the dopant diffusion would effectively shorten the electrical gate length and lead to a sub-threshold leakage current.

As will be appreciated by one skilled in the art, aspects of the present invention may be embodied as a system, method, device or apparatus. Aspects of the present invention are described below with reference to flowchart illustrations and/or block diagrams of methods, apparatus (systems) and devices according to embodiments of the invention. The flowchart and block diagrams in the Figures illustrate the architecture, functionality and operation of possible implementations of systems, methods, apparatuses and devices according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts.

It is to be understood that the present invention will be described in terms of a given illustrative architecture having a substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip including multigate devices according to the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIGS. 1-13, a set of processing stages in the fabrication of multigate devices in accordance with an exemplary implementation of the present principles is illustrated. FIG. 1 depicts a substrate 100 in which the multigate devices can be formed. Here, the substrate can be a bulk semiconductor substrate, such as silicon. Bulk substrates are preferable over silicon on insulator (SOI) substrates, as stressors can be formed deep into the fins, as described in more detail herein below. In addition, it should be understood that the substrate 100 may include any suitable material and is not limited to a silicon substrate. For example, substrate 100 may include Gallium Arsenide, monocrystalline silicon, Germanium, or any other material or combination of materials where the present principles may be applied. The substrate 100 can further comprise other features or structures that compose a circuit apparatus and are formed on or in the semiconductor substrate in other process steps.

Figure 2:
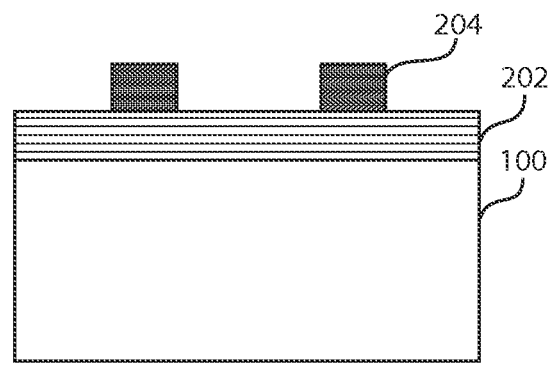
FIG. 2 is a cross-sectional view of an exemplary structure illustrating the formation of a hard mask and photoresist in accordance with an embodiment of the present principles.
Figure 3:
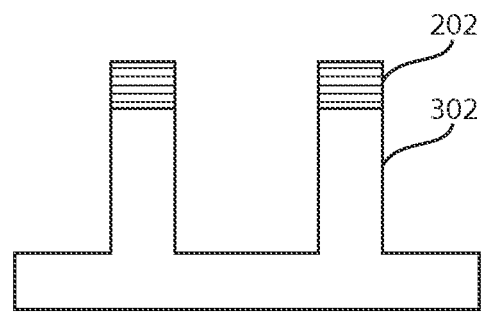
FIG. 3 is a cross-sectional view of an exemplary structure illustrating the formation of fins in accordance with an embodiment of the present principles.

As depicted in FIG. 2, a hard mask 202 can be deposited and a patterned photoresist 204 can be formed on the substrate 100. The hard mask 202 can be composed of SiN, TiN, a carbon-based hard mask or other materials. The hard mask 202 can be composed of any materials that have an etch selectivity greater than that of the substrate material. For example, if silicon is employed as the substrate 700, the hard mask 706 can be silicon dioxide, silicon nitride or spin-on-dielectric (SOD) or SiCN films. In addition, the exposed regions of the hardmask 202 can be etched and the photoresist 204 can be removed to form fins 302, as shown in FIG. 3. The etching can be implemented via reactive ion etching. A typical etch gas that can be employed is a mixture of HBr and $O_2$ at room temperature or a slightly higher temperature.

Figure 4:
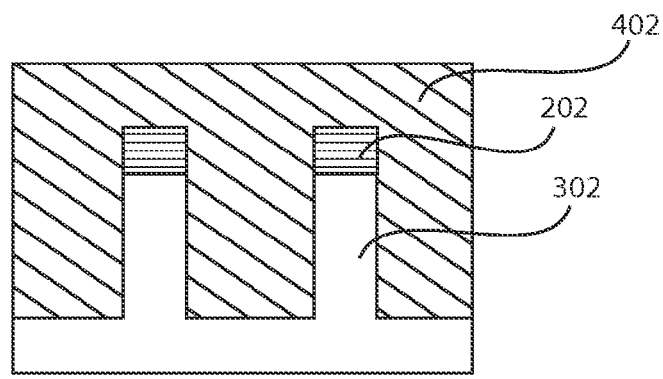
FIG. 4 is a cross-sectional view of an exemplary structure illustrating the formation of shallow trench isolation dielectric material in accordance with an embodiment of the present principles.
Figure 5:
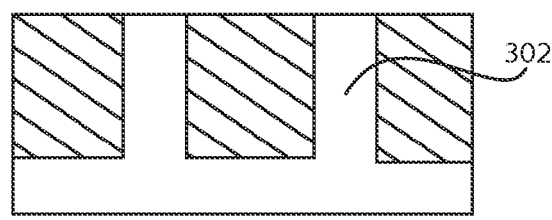
FIG. 5 is a cross-sectional view of an exemplary structure illustrating the removal of hard masks in accordance with an embodiment of the present principles.
Figure 6:
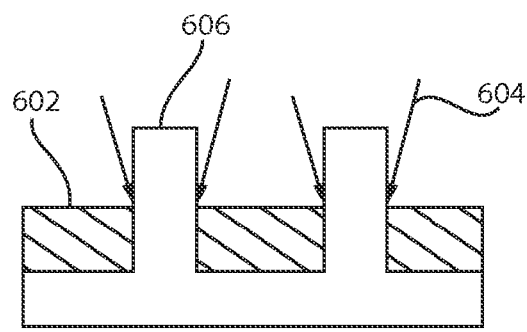
FIG. 6 is a cross-sectional view of an exemplary structure illustrating the formation of dielectric regions and a junction isolation process in accordance with an embodiment of the present principles.

Thereafter, an STI (shallow trench isolation) dielectric 402 can be deposited on the resulting structure as shown in FIG. 4. For example, the STI dielectric 402 can be silicon dioxide. Here, in order to fill the relatively small space between the fins, a chemical vapor deposition (CVD) of oxide film can be performed. A TEOS (Tetraethyl orthosilicate)/Ozone precursor is preferred for the deposition. In addition, dielectric regions 602 can be formed to isolate the various multigate devices. For example, a chemical mechanical planarization (CMP) process can be performed on the dielectric 402 and the hard mask 202 can be removed to expose the fins 302 as shown in FIG. 5. Further, as depicted in FIG. 6, dielectric recesses can be formed and dopants can be implanted to create a dopant junction and thereby isolate the fins 302 from the substrate. The fins can be doped with appropriate isolating dopants using a suitable doping process. For example, for junction isolation, the dopants can be carbon and can be introduced through ion implantation, plasma doping or epitaxial solid phase diffusion. Here, the implantation 604 is angled to ensure proper isolation of the fin 606 from the substrate. The implantation angle is dependent on the fin height and fin pitch. Preferred implantation angles range from about 7° to about 20°.

Figure 7:
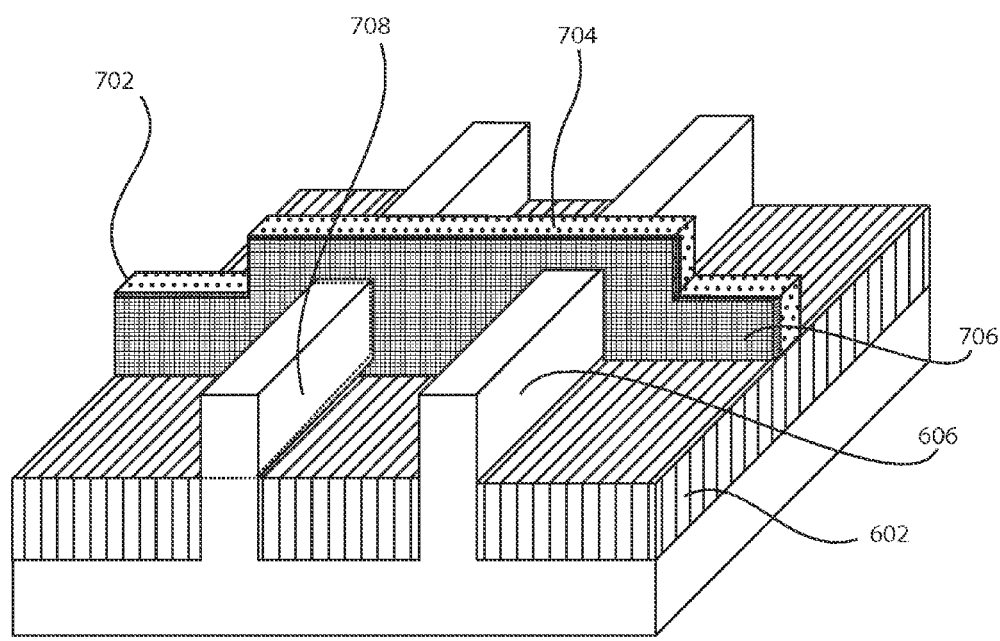
FIG. 7 is a cross-sectional view of an exemplary structure illustrating the formation of a gate structure in accordance with an embodiment of the present principles.

Referring to FIG. 7, a gate structure 702 can be formed over the fins 606. The gate structure 702 can include a high-dielectric constant (high-k) gate dielectric that overlays the fins 606 and a polysilicon material over the gate dielectric, which form the gate 704. This high-k gate can be contacted by various conductive materials to adjust its work function. For example, possible conductive materials that may be used for this purpose include TiN, TaN, TaC and W. The gate structure 702 can further include a spacer 706 to protect the gate 602 in subsequent processing steps. Here, the spacer 706 can be composed of a nitride, such as silicon nitride. The spacer 706 can be formed by depositing the nitride material over the gate 704 and performing appropriate etching processes.

Figure 8:
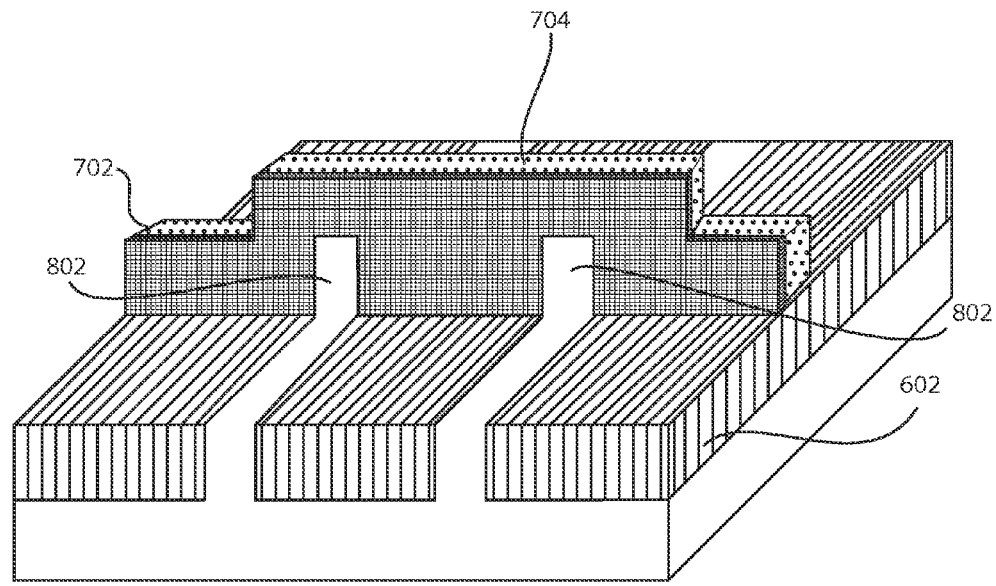
FIG. 8 is a cross-sectional view of an exemplary structure illustrating the removal of portions of fins to expose channel regions in accordance with an embodiment of the present principles.
Figure 9:
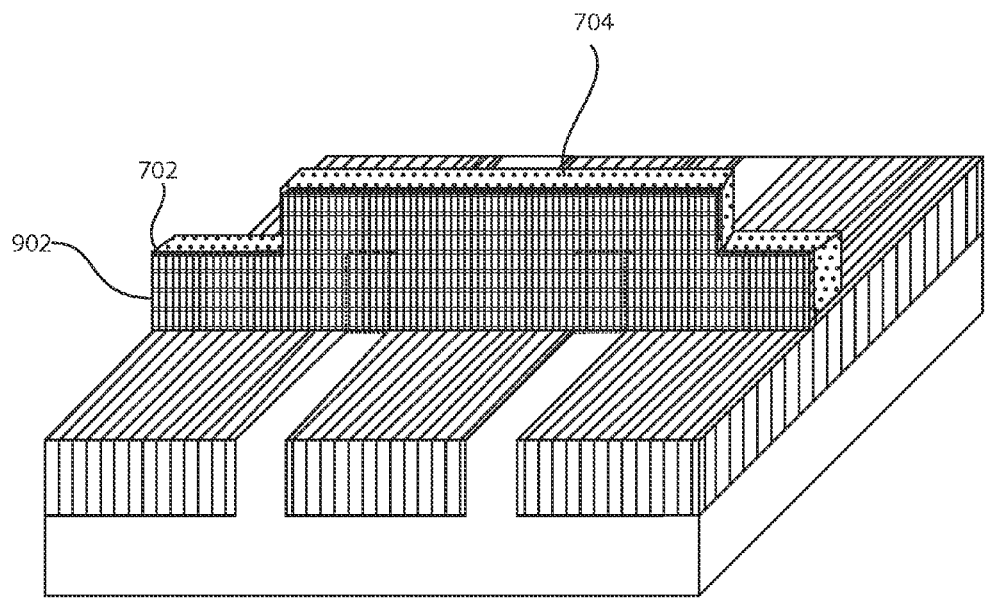
FIG. 9 is a cross-sectional view of an exemplary structure illustrating the formation of a spacer in accordance with an embodiment of the present principles.

As depicted in FIGS. 7-8, portions 708 of the fins 606 can be removed to form directional recesses and to expose the channel region 802 of the fins. For example, the removal of a silicon fin in the S/D area can be implemented by performing a silicon etch using an anisotropic reactive ion etching (RIE) process. The etching process can be carried out by using gas mixtures of $SF_6$, $O_2$ and $CHF_3$. The RIE can be implemented by employing a parallel-plate system with a radio frequency generator operating at 13.56 MHz and an automatic radio frequency matching network. The temperature of the lower electrode can be between about 10° C. and about 60° C. and can be controlled by backside heating or cooling using a temperature controlled oil-bath system.

Further, a disposable spacer 902 can be formed along the side of the gate structure 702 and the exposed channel regions 802 of the fins to protect the fin channel during subsequent etching processes. The spacer 902 can be made of a dielectric material. For example, the spacer 902 can be an oxide. Alternatively, the spacer 902 can be a silicon nitride spacer. In addition, the spacer 902 can be deposited by CVD, atomic layer deposition (ALD) or molecular layer deposition (MLD) using a variety of precursors, such as, for example, $N_2H_4$, $NH_3$, etc.

Figure 10:
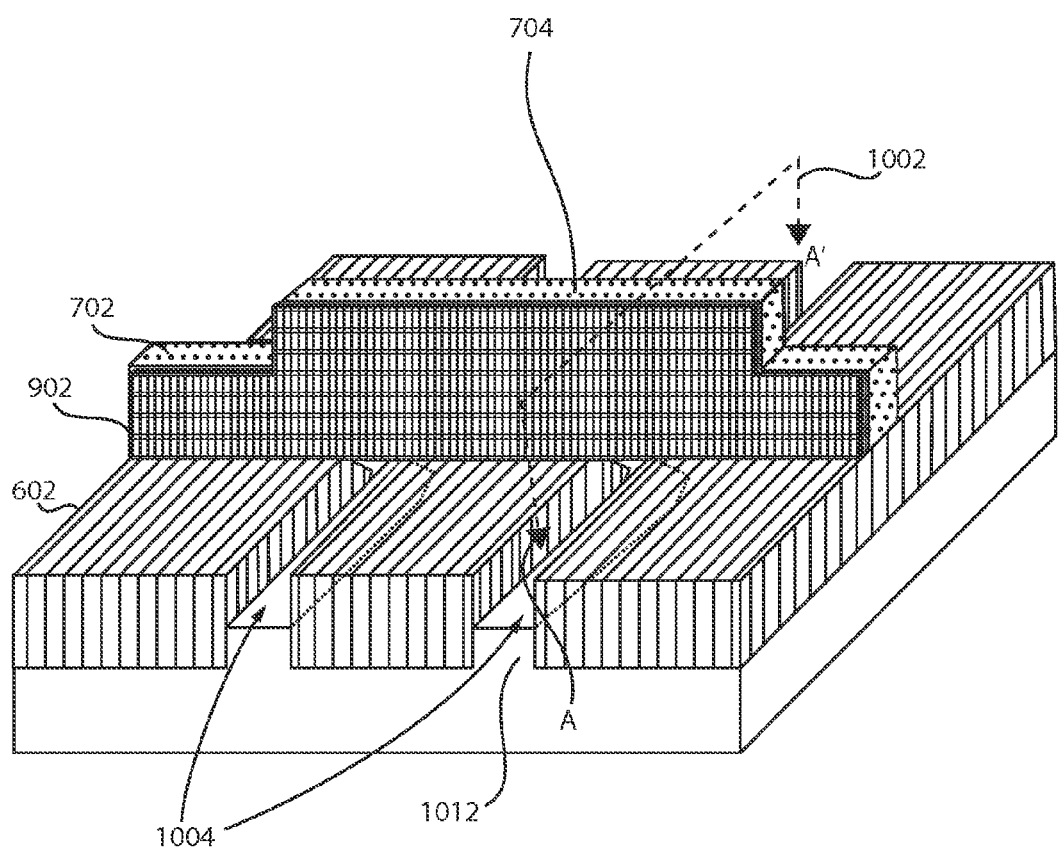
FIG. 10 is a cross-sectional view of an exemplary structure illustrating the formation of sigma-shaped recesses in accordance with an embodiment of the present principles.
Figure 11:
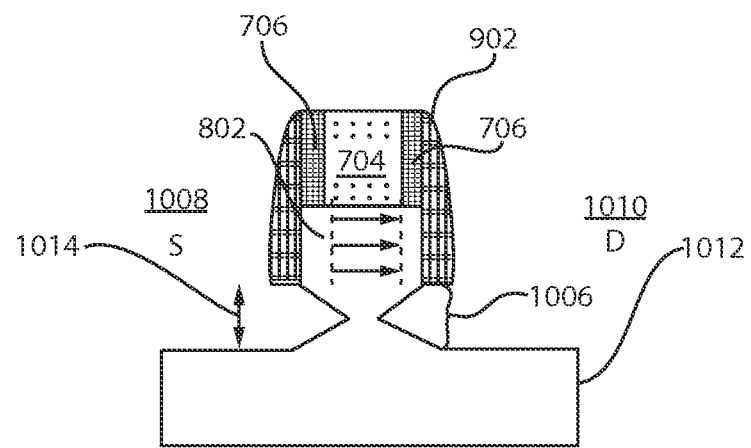
FIG. 11 is a cross-sectional view of an exemplary structure illustrating a sigma-shaped recessed portion in accordance with an embodiment of the present principles.

As illustrated in FIG. 10, a sigma-shaped recess 1004 can be formed underneath the channel region 802 of a fin. For example, a wet etch process can be implemented to form the recesses 1004. The process can be initiated with a silicon etch process, which can be chlorine-based, to recess the fin, as described above. Then, a chemical wet solution, such as KOH or $NH_4OH$, can be used to form the directional recess portion beneath the channel region 802. Thereafter, an epitaxial silicon buffer layer can be formed. The use of the spacer 902 during the wet etch process ensures that the channel region 802 remains intact and that the sigma-shaped recess is formed below the channel region 802, as shown in FIG. 11. FIG. 11 provides a view of the resulting multigate device taken along the A-A' 1002 cross-section in FIG. 10. As shown in FIG. 11, the remainder of the fin subsequent to the recess formation includes a bottom portion 1012, a sigma-shaped portion 1006 and the channel portion 802 between the source 1008 and the drain 1010 areas of the multigate device. In the exemplary embodiment depicted in FIG. 11, the channel portion 802 shares a common width with the gate structure 702 and retains the height of the original fin 606 above the surface of the STI region 602 bordering the fin. Here, the sigma-shaped portion 1006 is formed below the channel 802 to curb subsequent dopant diffusion from the source 1008 and/or drain 1010 regions to the channel region during a thermal annealing process. The diffusion would effectively shorten the electrical gate length and thus would lead to a sub-threshold leakage current. Further, it should also be noted that the recess depth 1014 below the top surface of the STI region 602 can be optimized to enhance the stress on the channel region 802. The optimal depth can be determined based on the fin height and the sigma-shape tip location (i.e., bordering the centers of the indentations in the portion 1006) of the stressor material used in the structure.

Figure 12:
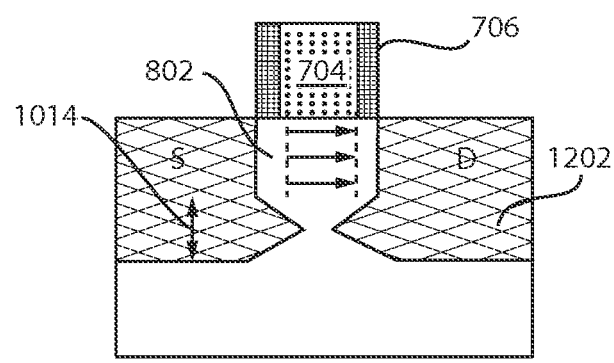
FIG. 12 is a cross-sectional view of an exemplary structure illustrating the epitaxial growth of a stressor in accordance with an embodiment of the present principles.

As illustrated in FIG. 12, which also provides a view along the A-A' cross-section 1002, the spacers 902 can be removed and an epitaxial growth process can be implemented to fill the recesses 1004 with an appropriate stressor material 1202. For example, as indicated above, the stressor material 1202 can be SiGe. The strained-layer epitaxy can be implemented in an ultra-high vacuum CVD or a low pressure CVD system.

Figure 13:
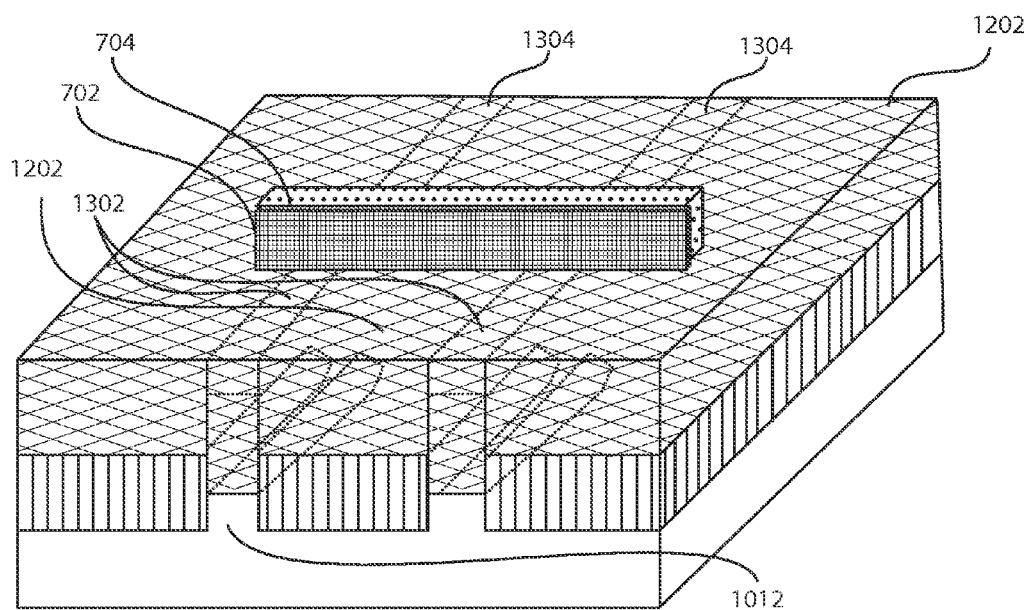
FIG. 13 is a cross-sectional view of an exemplary structure illustrating the completion of the epitaxial growth of a stressor in accordance with an embodiment of the present principles.

Carbon can be added to suppress boron diffusion without affecting the device performance. The cleaning of a silicon substrate can be achieved by a combination of an ex-situ wet chemical treatment, e.g. using SC-2, HCl, $H_2O_2$ and $H_2O$ at between about 75° C. and about 85° C., and an in-situ $H_2$ prebaking process performed at about 850° C. in the reaction chamber before epitaxial deposition. After cleaning the substrate surface, in an embodiment in which SiGe is used as the stressor material 1202, the heteroepitaxy of the stressor material can be performed between about 500° C. and 700° C. depending on the target layer parameters, especially the Ge content. $GeH_4$ and/or $SiGe_4$ can be the sources for the SiGe growth and hydrogen can be used as the carrier gas. To impose a stress on the channel region, the stressor 1202 can be configured to have a crystal lattice structure is different from the lattice structure of the channel portion 802, the sigma-shaped portion 1006 and the bottom portion 1012 of the original fin. The epitaxial growth can continue above the STI regions 602 to the height of the original fin, which in this embodiment is the top of the channel region 802, as shown in FIG. 13. Optionally, an additional junction implant can be formed as described above with respect to FIG. 6 to ensure that the substrate is isolated from the fins. Source and drain regions can be formed by doping the areas occupied by the extensions of the original fins 606. For example, the areas can be doped in-situ during the epitaxial growth process described above with respect to FIG. 12 or can be subsequently implanted via ion implantation. The doping can be implemented with appropriate p- or n-type dopants using any suitable doping process. Thereafter, fabrication of the devices can be completed. For example, contacts, vias, metal lines, and/or interlayer dielectrics, etc. can be formed as is known in the art to complete the exemplary multigate devices.

It should be noted that although the fabrication of only two multigate devices that have a common gate structure is shown in FIGS. 1-13, a larger number of multigate devices that share the common gate structure can be fabricated in the same manner discussed above. Further, different sets of multigate devices that each share their own corresponding, separate gate structure can also be formed in the same manner described above to fabricate a circuit apparatus.

Figure 14:
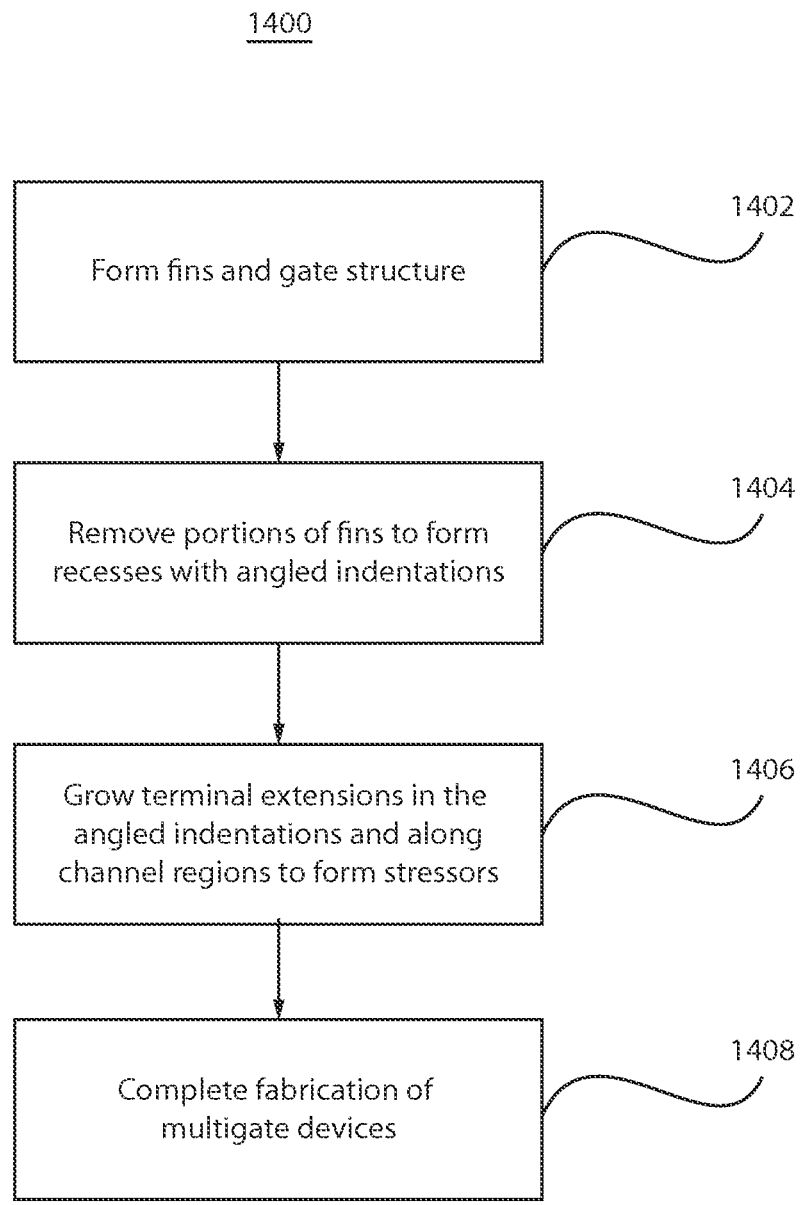
FIG. 14 is a high-level block/flow diagram of a method for fabricating multigate transistor devices in accordance with an embodiment of the present principles.

Referring now to FIG. 14, with continuing reference to FIGS. 1-13, a method 1400 for fabricating a plurality of multigate devices that can be part of a circuit apparatus is illustratively depicted. It should be understood that the aspects of multigate devices and of their fabrication described above can be incorporated into method 1400 and into the multigate devices formed in accordance with the method 1400. The method 1400 can begin at step 1402, in which fins and a gate structure can be formed. For example, the fins 606 and the gate structure 702 can be formed as described above with respect to FIGS. 1-7. As shown in FIG. 7, the gate structure can be disposed on a plurality of surfaces of the fins 606. In the particular embodiment illustrated in FIG. 7, the gate structure 702 can be disposed on the top surface and portions of the side surfaces of each of the fins 602.

At step 1404, at least a portion of an extension of each fin can be removed to form a recessed portion with at least one angled indentation in each of the fins. For example, portions of the extensions of each fin can be removed to form the recesses 1004 and recessed portions 1006 as described above with respect to FIGS. 8-11. Further, a recess 1004 and a recessed portion 1006 can be formed in a plurality of the fins for the multigate devices fabricated in accordance with method 1400. As shown in FIG. 11, the recessed portion 1006 can be below the gate structure 702 and below the channel region 802 of the respective fin. Further, the recessed portion 1006 can include angled indentations. For example, as shown in FIG. 11 and as described above, the angled indentations can be sigma-shaped to enable a stressor material to impose an enhanced stress on the channel region 802 and thereby increase the mobility of charge carriers in the channel region 802. Further, the angled indentations can commence from the bottom of the channel region 802 as, for example, illustrated in FIG. 11. The channel region 802 provides a conductive channel between a source and drain terminal of the multigate device in response to activation by the gate structure 702. It should also be noted that the extensions of the fins 602 need not be completely removed. For example, as described above, a base portion 1012 of the fins 602 can remain after the portion of the extension is removed. The base portion 1012 can be below the recessed portion 1006 and can extend from below the channel region 802 to the end of the extensions of the original fin 602, as shown in FIGS. 10-11.

At step 1406, terminal extensions can be grown in the angled indentations and along the channel regions to form stressors. For example, a stressor 1202 can be formed on each side of the gate structure 702 as described above with respect to FIGS. 12 and 13. As illustrated in FIG. 12, the stressors 1202 can be grown within the sigma-shaped angled indentions of the recessed portion 1006 below the channel region 802 and along the side surfaces of the channel region 802. Further, due to its proximity to the channel region in the angled indentations of the recessed portion 1006, the stressor 1202 can more effectively impose a stress on the channel region 802 to enhance charge carrier mobility in the channel region 802. Moreover, as described above with respect to FIGS. 12-13, the stressors 1202 can be grown into the recesses 1004 and over a plurality of the base portions 1012 on either side or both sides of the gate structure 702. In addition, source and drain extensions can be formed in the stressors 1202 with suitable dopants using an appropriate doping process, for example as described above with respect to FIG. 13. Here, regions 1302 of the stressor 1202 that are above the base portions 1012 and that border side surfaces of the channel region 802 can be doped using, for example, ion implantation or in-situ doping to form source terminal extensions of the multigate devices. Additionally, regions 1304 of the stressor 1202 that are above the base portions 1012 and that border side surfaces of the channel region 802 on the opposing side of the gate structure 702 can be similarly doped to form drain terminal extensions of the multigate devices. It should be noted that a terminal extension can be delineated by the region of the stressor 1202 that occupies the portion of a fin at a given side of the gate structure 702 removed at step 1404. However, it should be understood that the entire terminal extension need not be doped to implement embodiments of the present principles. The terminal extensions can be in contact with each of the channel regions of the multigate devices, can extend into each of the indentations below the channel regions of the multigate devices and can provide stresses on the channel region to enhance charge carrier mobility in the channel regions. For example, each of the terminal extensions on a given side of the gate structure can be part of a cohesive lattice structure formed by the stressor 1202. Furthermore, the lattice structure of the stressor 1202 can be different from each of the lattice structures formed by the remaining portions of the original fins. In particular, the lattice structure of the stressor 1202 can be different from the cohesive lattice structure formed by the channel region 802, the recessed portion 1006 and the base portion 1012 of a given multigate device. Thereafter, at step 1408, the fabrication of the multigate devices can be completed. For example, as stated above, contacts, vias, metal lines, and/or inter-layer dielectrics, etc. can be formed as is known in the art to complete the exemplary multigate devices.

Having described preferred embodiments of multigate transistor devices including embedded stressors and methods of their fabrication (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the detailed and particularity required by the patent laws, what is claimed and desired protected by Letters Patent is set forth if the appended claims.

What is claimed is:

1. A multigate transistor device comprising:
   a gate structure including a gate electrode and a gate dielectric;
   a channel region that includes a plurality of surfaces on which the gate structure is disposed and is configured to provide all conductive channels for charge carriers between a source and a drain of the device in response to activation by the gate structure;
   a recessed portion that is under the gate structure and under the conductive channel and includes at least one angled indentation; and
   terminal extensions that are in contact with the channel region, wherein at least one of the extensions is the source or the drain of the device, extends into the at least one angled indentation under the channel region and provides a stress on the channel region such that charge carrier mobility is enhanced in the channel region.

2. The multigate transistor device of claim 1, wherein the recessed portion and the channel region form a cohesive lattice structure and wherein the at least one of the extensions has a lattice structure that is different from the lattice structure of the channel region and the recessed portion.

3. The multigate transistor device of claim 1, wherein the at least one angled indentation is sigma-shaped.

4. The multigate transistor device of claim 1, wherein the at least one angled indentation commences from a bottom of the channel region.

5. The multigate transistor device of claim 1, further comprising:
   a base portion that is below the recessed portion and extends from below the channel region to below the at least one of the extensions.

6. The multigate transistor device of claim 5, wherein the channel region, the recessed portion and the base portion form a cohesive lattice structure and wherein the at least one of the extensions has a lattice structure that is different from the lattice structure of the channel region, the recessed portion and the base portion.

7. A circuit apparatus comprising:
   a plurality of multigate devices and a gate structure, wherein each of the multigate devices includes a channel region, a recessed portion and a terminal extension,
   wherein the channel region includes a plurality of surfaces on which the gate structure is disposed and is configured to provide all conductive channels for charge carriers between a source and a drain of the respective multigate device in response to activation by the gate structure,
   wherein the recessed portion is under the gate structure and under the conductive channel and includes at least one angled indentation, and
   wherein each of the terminal extensions of the multigate devices is a source or a drain of one of the devices and wherein the terminal extensions form a cohesive lattice structure that is in contact with each of the channel regions of the multigate devices, extends into each of the indentations under the channel regions of the multigate devices and provides stresses on the channel regions such that charge carrier mobility is enhanced in the channel regions.

8. The circuit apparatus of claim 7, wherein the recessed portion and the channel region of each of the multigate devices form a respective cohesive lattice structure that is different from the lattice structure of the terminal extensions.

9. The circuit apparatus of claim 7, wherein the at least one angled indentation of at least one of the multigate devices is sigma-shaped.

10. The circuit apparatus of claim 7, wherein the at least one angled indentation of at least one of the multigate devices commences from a bottom of the respective channel region.

11. The circuit apparatus of claim 7, wherein at least one of the multigate devices further comprises a base portion that is below the respective recessed portion and that extends from below the respective channel region to below the respective terminal extension.

12. The circuit apparatus of claim 11, wherein the respective channel region, the respective recessed portion and the base portion form a cohesive lattice structure that is different from the lattice structure of the terminal extensions.

13. The multigate transistor device of claim 1, wherein the at least one angled indentation is disposed under the gate electrode.

14. The circuit apparatus of claim 7, wherein the at least one angled indentation of each respective multigate device is disposed under a gate electrode of the gate structure of the respective multigate device.

* * * * *